United States Patent

[11] 3,577,044

[72] Inventors William J. Armstrong;
Albert M. Healy, Essex Junction, Vt.;
Michael C. Duffy, Poughkeepsie, N.Y.

[21] Appl. No. 758,166
[22] Filed Apr. 8, 1968
Division of Ser. No. 532,754, Mar. 8, 1966, Pat. No. 3,476,224 Dec. 17, 1968.
[45] Patented May 4, 1971

[73] Assignee International Business Machines Corporation
Armonk, N.Y.

[54] INTEGRATED SEMICONDUCTOR DEVICES AND FABRICATION METHODS THEREFOR
6 Claims, 17 Drawing Figs.

[52] U.S. Cl. .......... 317/235, 317/234
[51] Int. Cl. .......... H01l 19/00
[50] Field of Search .......... 317/235/22.11, 235 (official), 235.31, 235/22, 234/3.1; 317/(Inquired)

[56] References Cited

UNITED STATES PATENTS

| | | | |
|---|---|---|---|
| 3,392,312 | 7/1968 | Carman .......... | 317/234 |
| 3,290,753 | 12/1966 | Chang .......... | 29/25.3 |
| 3,407,479 | 10/1968 | Fordemwalt .......... | 29/577 |
| 3,332,137 | 7/1967 | Kenney .......... | 29/423 |

*Primary Examiner*—John W. Huckert
*Assistant Examiner*—Martin H. Edlow
*Attorney*—Hanifin and Jancin

ABSTRACT: This invention is directed generally to integrated semiconductor devices including fabrication methods therefor and, more particularly, to insulator encapsulated, dielectrically isolated, integrated semiconductor devices including fabrication methods therefor.

*INVENTORS*
WILLIAM J. ARMSTRONG
MICHAEL C. DUFFY
ALBERT M. HEALY
BY
J. B. Kraft
ATTORNEY

INTEGRATED SEMICONDUCTOR DEVICES AND FABRICATION METHODS THEREFOR

This is a division of application, Ser. No. 532,754, filed Mar. 8, 1966 now U.S. Pat. No. 3,416,224.

Recent trends in the semiconductor art have been in the direction of miniaturization of semiconductor device structures to achieve higher operating speeds, lower cost of fabrication, and greater component reliability. Some of these miniature semiconductor devices are fabricated in a single substrate of the same material as the semiconductor devices. Other fabrication techniques form a number of semiconductor devices in a support structure of any desired material. These fabrication techniques are being extensively developed in order to permit the utilization of semiconductor device components into large and complex electronic equipment, such as computers for higher speed operation. However, in order to reduce the expense in making individual semiconductor device components for electronic equipment, it was necessary to devise improved techniques to batch fabricate large numbers of active circuit elements each of which must be electrically isolated from each other thereby permitting electrical connection thereto as desired.

At the present time, most conventional integrated circuitry is isolated by the use of PN junctions. However, it has been found that PN junctions have a number of disadvantages. One is that there is an appreciable leakage associated with such junctions particularly at elevated temperatures. Also, there is a very high capacitance per unit area associated with such junctions. Furthermore, a PN junction has a disadvantage in that it has a high resistance in one direction only. As a result, in most integrated circuitry, the speed and performance are limited primarily not by the active elements, but by the isolating PN junctions. There is, therefore, a need for a new and improved structure and method which can be utilized for isolating semiconductor devices in an integrated structure.

In isolating each of a number of semiconductor devices in a single substrate, various dielectric isolation techniques are used. One such isolation technique is to provide electrically insulating material such as silicon dioxide between each of the semiconductor devices in such a manner as to prevent electrical shorting between two or more of the semiconductor devices. This invention is directed to this type of isolation.

In discussing the integrated semiconductor device of this invention, the usual terminology that is well known in the transistor field will be used. In discussing concentrations, references will be made to majority or minority carriers. By "-carriers" is signified the free-holes or electrons which are responsible for the passage of current through a semiconductor material. Majority carriers are used in reference to those carriers in the material under discussion, i.e., holes in P-type material or electrons in N-type material. By use of the terminology "minority carriers" it is intended to signify those carriers in the minority, i.e., holes in N-type material or electrons in P-type material. In the most common type of semiconductor materials used in present day transistor structures, carrier concentration is generally due to the concentration of the "significant impurity," that is, impurities which impart conductivity characteristics to extrinsic semiconductor materials.

Although for the purpose of describing this invention reference will be made to an N-P-N configuration wherein the P-region is utilized as the base region, it is to be understood such a structure is merely illustrative and that a P-N-P structure may also be suitably adapted to the purpose of this invention. In addition, while the integrated semiconductor device arrangement of this invention shows transistor structures, it is obvious to those skilled in the art that diodes, PNPN NPNP, and other semiconductor devices or passive elements such as resistors, capacitors, inductors, etc. can be used in accordance with the method of this invention.

In fabricating electrically isolated semiconductor devices in a substrate, many schemes have been proposed which require a large number of process steps. For example, in one such scheme, a wafer of single crystal semiconductor material is utilized as the base material and a network of channels are formed on one surface of the single crystal semiconductor material using conventional photolithographic masking and etching techniques. Subsequently, an insulating layer, preferably silicon dioxide, is deposited on the surface of the channel-shaped semiconductor surface and a polycrystalline semiconductor layer is grown or deposited on the oxide layer. The single crystal semiconductor material is then etched or mechanically lapped down to form isolated regions of single crystal material. Finally, by suitable diffusion techniques semiconductor devices are formed in the isolated regions of single crystal semiconductor material.

Other more complicated fabrication schemes use two layers of polycrystalline semiconductor material such as silicon in forming isolated semiconductor devices. In all of these previous fabrication processes, the ultimate objective was to form isolated semiconductor devices in or on a suitable substrate support which meets thermal and mechanical stresses during both manufacture and use. One disadvantage associated with these prior art fabrication schemes, besides being complex, is that the semiconductor devices could not be uniformly made due to the fact that the etching step required to form the channels in the monocrystalline or single crystal semiconductor material did not always produce uniform channels. Hence, the isolated regions of semiconductor material had varying thicknesses which resulted in the formation of nonuniform semiconductor devices in a substrate.

Accordingly, it is an object of this invention to provide a more simplified process for producing electrically isolated semiconductor devices on a substrate.

It is another object of this invention to provide a process for forming dielectrically isolated silicon semiconductor devices on a substrate capable of sustaining stresses during fabrication and use.

It is a further object of this invention to provide an integrated semiconductor device having a plurality of dielectrically isolated semiconductor devices formed on a dielectrically coated substrate.

In accordance with a particular form of the invention, the method of forming a plurality of electrically isolated semiconductor devices comprises adhering monocrystalline semiconductor material on one side of an insulating member and adhering polycrystalline semiconductor material to the opposite side of the insulating member. Semiconductor devices are formed in the monocrystalline material preferably prior to etching isolation moats between the formed semiconductor devices. An insulating layer is deposited on the moat isolated semiconductor surface and electrical leads are applied to the active portion of each semiconductor device through suitable openings formed in the deposited insulating layer.

Also in accordance with the invention, there is provided an integrated semiconductor device arrangement which includes a substrate that serves as a support for semiconductor devices mounted thereon. Each of the semiconductor devices is electrically isolated from the others by means of a glass layer formed on the surface of each device and in the moat or channel region formed between each of the devices. Each of the devices is bonded to a glass layer which is in turn bonded to a polycrystalline substrate.

The foregoing and other objects, features and advantages of the invention will be apparent from the following more particular description of preferred embodiments of the invention, as illustrated in the accompanying drawings.

Figure 1:
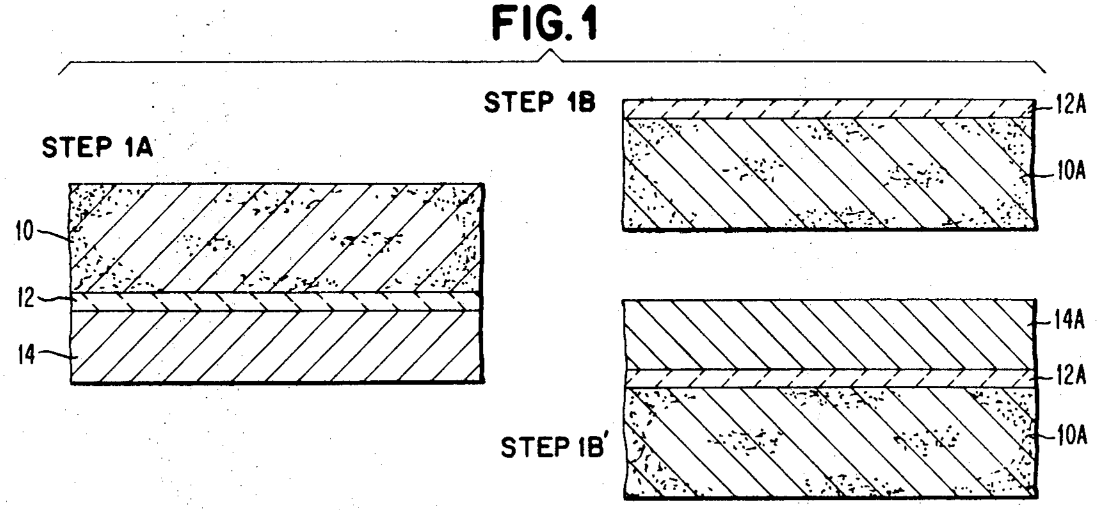
FIG. 1 is a flow diagram showing alternative steps, in cross section, of the fabrication process for forming a monocrystalline semiconductor wafer on a dielectrically coated substrate.

Referring to FIG. 1, step 1A illustrates a composite structure which comprises a monocrystalline semiconductor substrate 10, an insulating layer or member 12, and a base member or layer 14. The monocrystalline substrate 10 preferably comprises a doped silicon layer of N-type conductivity which can be fabricated by conventional techniques such as by pulling a monocrystalline member from a melt containing the desired impurity concentration and then slicing the pulled monocrystalline member into a plurality of wafers. If desired, the entire wafer or individual diced portions thereof is bonded to one side of the insulating member 12 which is preferably composed of glass that is compatible with the thermal expansion coefficients of monocrystalline and polycrystalline silicon. At preferably the same time as the bonding of the monocrystalline substrate 10 to glass member 12, the polycrystalline substrate 14 is bonded to the other side of the glass member 12. Both bonding operations can be carried out by heating the composite structure in a suitable jig to above the softening point of the glass. A temperature of 1,200° C. has been found suitable with the below recited glass composition. One glass that has been found to meet the standards of having thermal compatibility with monocrystalline and polycrystalline silicon and a high melting or softening point (approximately 1,172° C.) is a composition in weight percent, of 82.8 percent of $SiO_2$; 11.4 percent of $B_2O_3$; 5.3 percent of $Al_2O_3$ and trace amounts of both $Na_2O$ and $ZrO_2$. The glass member 12 can be fabricated by first ball milling the requisite ingredients and then forming the glass member 12 by suitable firing, sintering, and freezing operations.

Referring to an alternative fabrication process, monocrystalline semiconductor wafer 10A (step 1B) has a layer 12A of glass formed on the surface thereof by either centrifuging techniques as illustrated by U.S. Pat. Nos. 3,212,921 and 3,212,929 issued to W. A. Pliskin et al. and assigned to the same assignee as this invention or by R. F. sputtering techniques as illustrated by a patent application identified as Ser. No. 428,733, filed Jan. 28, 1965, in the names of Davidse and Maissel and assigned to the same assignee as this invention. Subsequently, referring to step 1B′ a layer of polycrystalline silicon 14A is deposited on the glass layer 12A by conventional vapor deposition or sputtering techniques.

A further alternative way to fabricate the composite structure shown in FIG. 1B′ is to form a glass coating on the monocrystalline substrate 10A as shown in FIG. 1B and to also form a glass coating on a surface of the polycrystalline member 14A. Subsequently, the glass coated monocrystalline substrate 10A and the glass coated polycrystalline member 14A are placed in contact, in a suitable jig, so as to permit the glass coatings to be bonded together to form a single glass layer 12A when the structure is heated at or above the softening temperature of the glass forming the coating.

Consequently, a semiconductor layer of monocrystalline material 10 (step 1A) or 10A (step 1B′) is formed on a glass coated polycrystalline substrate 14 or 14A which provides a strong support during fabrication and use and also permits ultimate electrical isolation along the bottom portion of each of the semiconductor devices that are formed in the monocrystalline semiconductor layer 10 or 10A.

Figure 2:
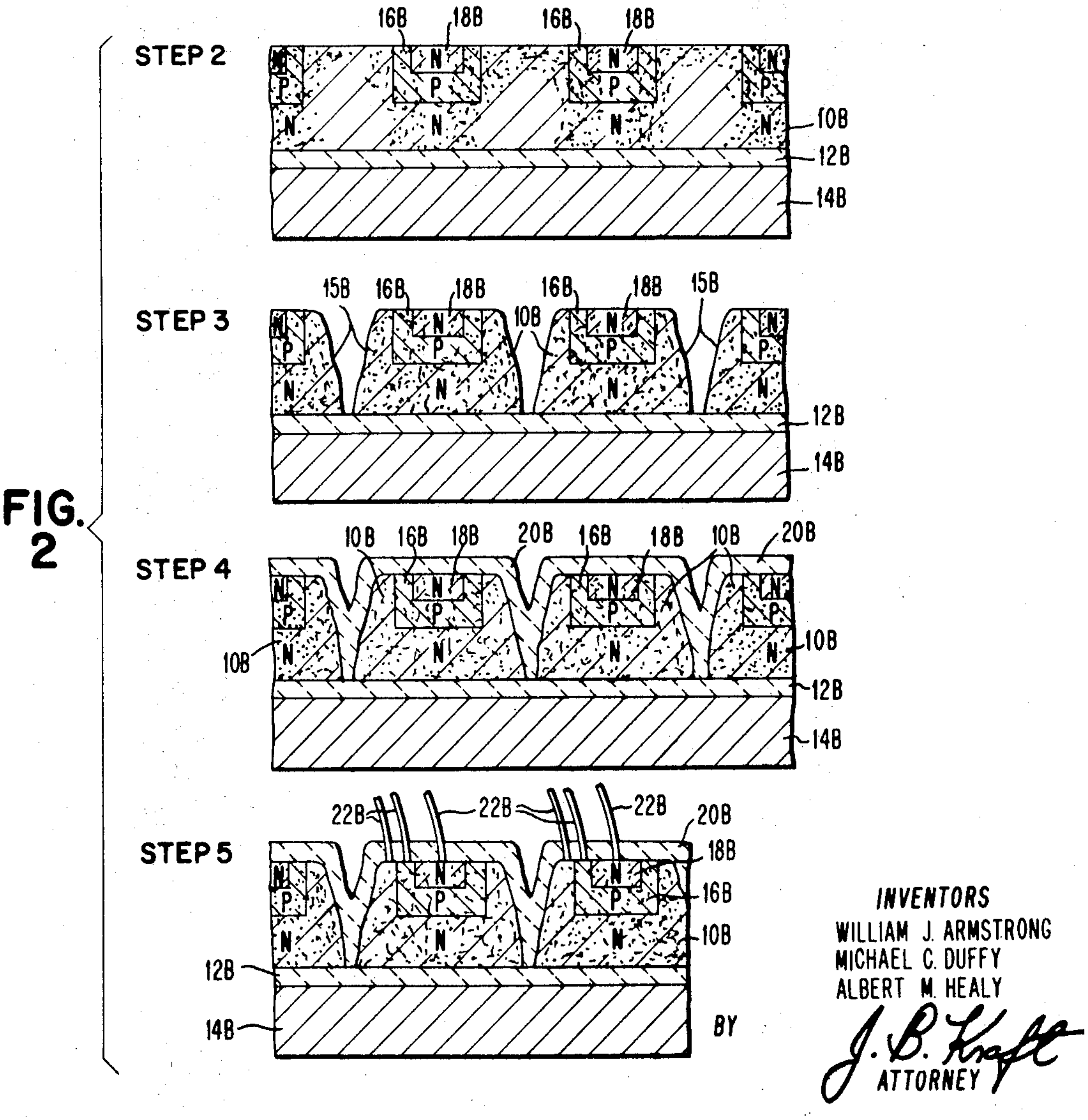
FIG. 2 is a flow diagram, in cross section, of the steps for fabricating an integrated semiconductor device arrangement from the structure of step 1A or step 1B' of FIG. 1.

Referring to FIG. 2 which is the continuation of the fabrication process using the composite structure of either step 1A or step 1B′, step 2 discloses monocrystalline semiconductor layer 10B bonded to a glass layer 12B which is bonded to a polycrystalline substrate 14B. While the layer 10B is shown larger in thickness than the layer 14B, this is done for purposes of better illustration and it is readily apparent to those skilled in the art that the substrate 14B is usually much thicker than the monocrystalline layer 10B. In one example, the layer 10B, after usual lapping and etching procedures, had a thickness less than 10 microns; the layer 12B had a thickness of 1—2 microns; and the substrate 14B had a thickness of about 8 mils. Subsequently, by conventional photolithographic masking and etching procedures and by standard diffusion techniques a plurality of P-type and N-type diffusions are carried out in the N-type monocrystalline semiconductor layer 10B so as to form base regions 16B and emitter regions 18B with the region 10B serving as the collector region for a transistor device.

Referring to step 3, a series of moats 15B are etched through the semiconductor layer 10B, by conventional photolithographic masking and etching techniques to form a series of electrically isolated devices on a glass coated polycrystalline substrate 14B. One etchant that can be used in a standard HF-$HNO_3$ solution which will etch away the semiconductor material down to the surface of the glass layer 12B.

Referring to step 4, an insulating layer 20B is deposited by centrifuging or R.F. sputtering techniques on the moat isolated semiconductor surface thereby providing a plurality of encapsulated semiconductor devices electrically isolated from each other on a single substrate. If desired, the layer 20B can be formed by thermally growing an oxide surface layer on the semiconductor surface thereby forming an $SiO_2$ layer if the semiconductor material is silicon. As can be seen from the figure of step 4, each device is located within an insulating envelope. The insulating layer 20B can also be a silicon nitride layer or a glass layer such as the glass layer 12B. For enhanced stability, the layer 20B is preferably a combination of an $SiO_2$ layer in contact with the semiconductor surface and glass overcoat layer as taught by a patent application identified as Ser. No. 141,669, filed Sept. 29, 1961, in the names of Perri and Riseman and assigned to the same assignee as this invention.

Referring to step 5, a plurality of leads 22B are individually applied to each of the active portions 18B, 16B and 10B of each of the semiconductor devices. The manner of applying the electrical leads to the active portion of each device is by conventional etching of holes in the insulating layer 20B and subsequently forming the electrically conductive leads 22B by metal evaporation or sputtering techniques.

Using the silicon member 10B with the glass layer 12B of the type identified above and a substrate 14B made of polycrystalline silicon, it was found that the matching thermal expansion coefficients prevented warping, twisting, or fracture of the integrated semiconductor device. Furthermore, the semiconductor devices that are formed on the glass coated polycrystalline substrate are uniformly made since careful thickness control can be obtained of the starting semiconductor layer or member 10B.

It should be evident to those skilled in the art that the diffusion operation carried out in step 2 of FIG. 2 can also be carried out in step 3 after the isolation moats are formed. Furthermore, epitaxial growth techniques can be used to form the semiconductor devices. For example, one type of conductivity could be epitaxially formed on a thinner semiconductor layer 10B of the opposite type conductivity and subsequently, emitter regions can be formed, by conventional diffusion techniques, in the epitaxially grown layer.

Figure 3:
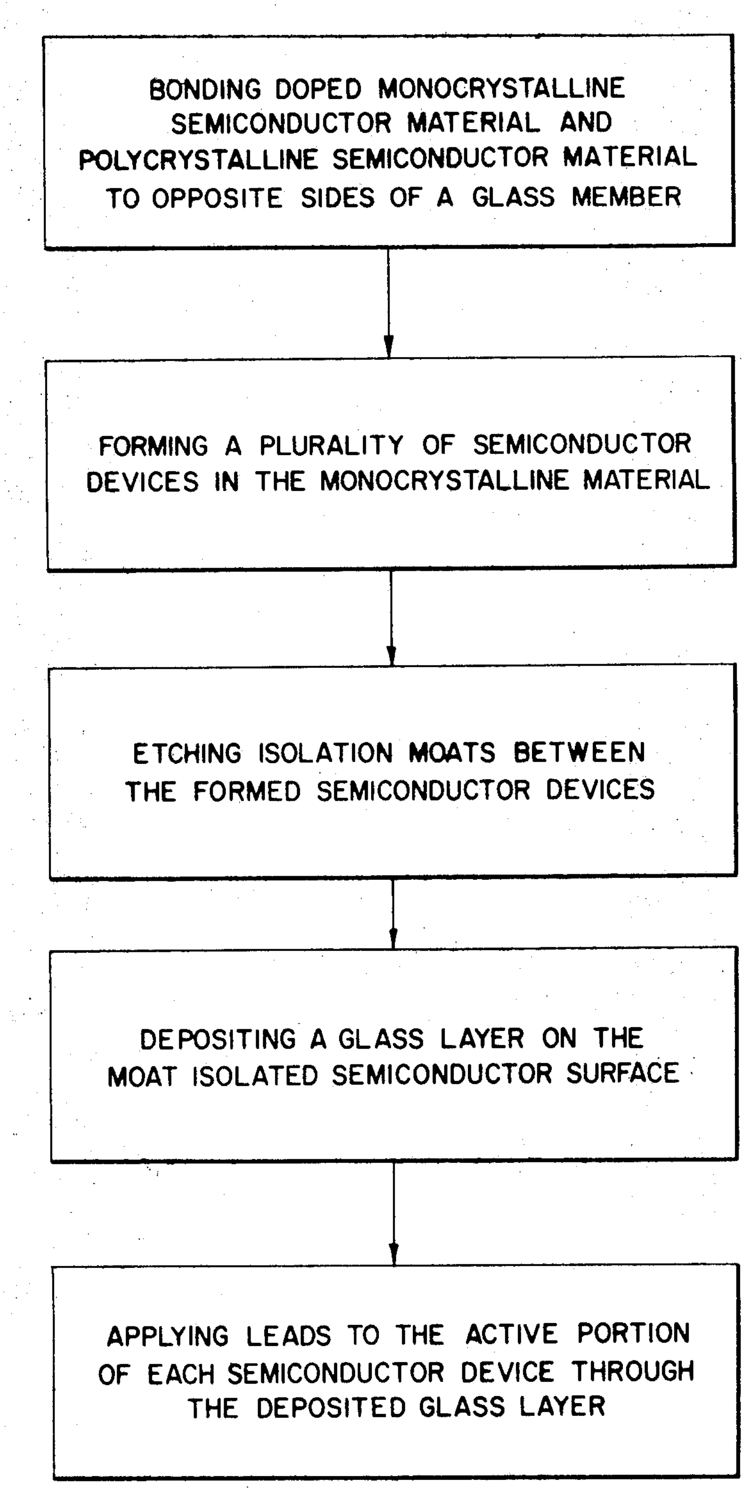
FIG. 3 is a flow diagram of the steps in the fabrication of the integrated semiconductor device arrangement shown in step 5 of FIG. 2.

Referring to FIG. 3, a flow diagram, in block form, is shown of the fabrication process depicted in FIGS. 1 and 2. The resulting product is a completely dielectric encapsulated integrated structure containing a plurality of electrically isolated semiconductor devices.

Figure 4:
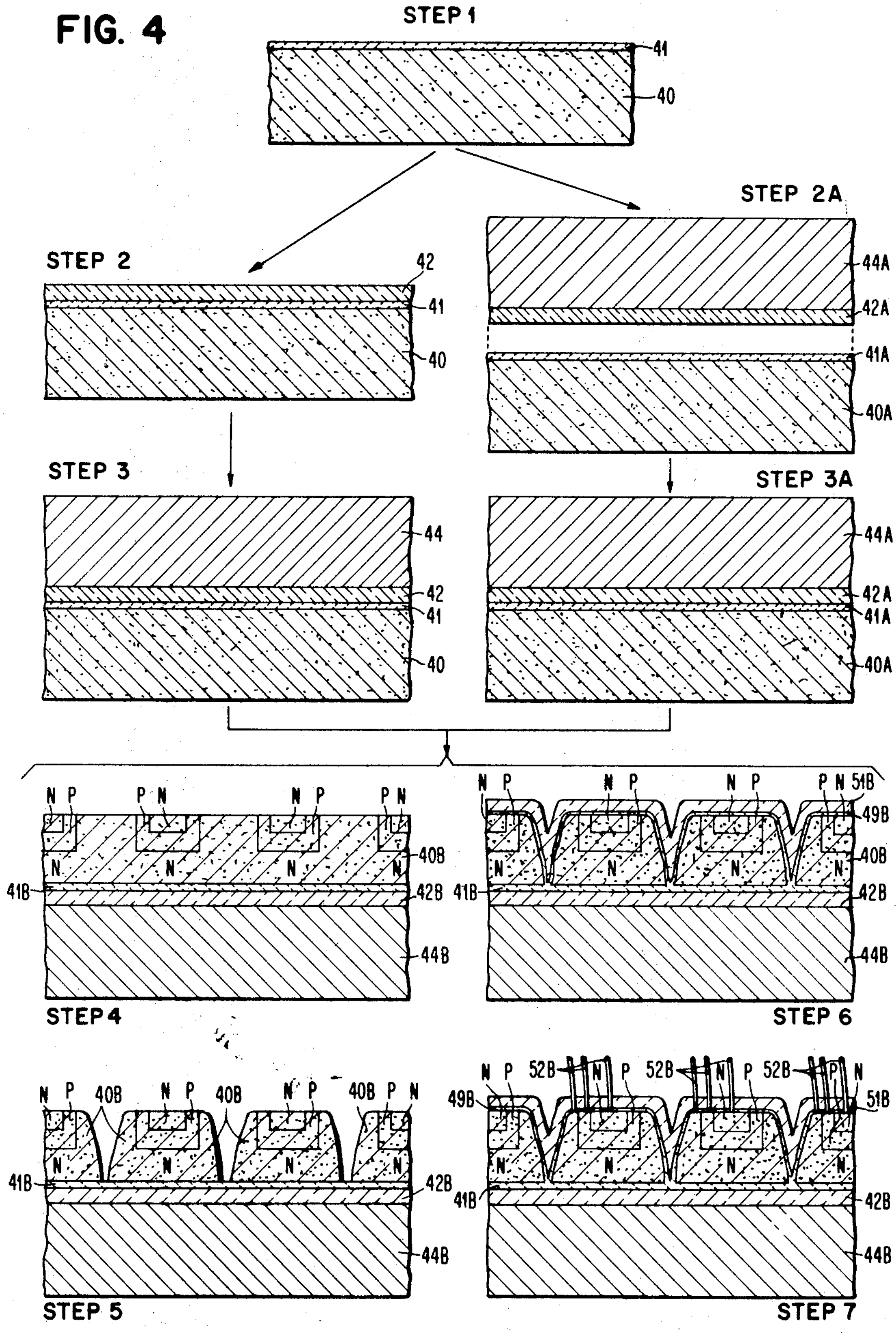
FIG. 4 is a flow diagram, in cross section, of the steps for fabricating an alternative integrated structure.

Referring to FIG. 4, a plurality of fabrication steps are shown for forming an improved dielectric encapsulation to enhance the stability of the integrated structure. Step 1 illustrates a monocrystalline substrate 40 preferably of silicon having an $SiO_2$ coating 41. The $SiO_2$ coating 41 can be formed by conventional thermal growth or by deposition techniques such as evaporation or sputtering.

In step 2, a glass layer 42 similar to the glass layer 12B of FIG. 2 is formed on the $SiO_2$ layer 41 by centrifuging or sputtering techniques. Hence, the $SiO_2$ layer 41 and the glass layer 42 serve as the base dielectric layer for the semiconductor devices that are formed thereon. Preferably, the $SiO_2$ layer 41 is approximately half the thickness of the glass layer 42 to preserve optimum matching of thermal coefficients of expansion and yet permit better adherence of the monocrystalline layer 40 to the glass layer 42. In addition, the $SiO_2$ layer 41 serves to act as a barrier or buffer region for undesirable impurities in the glass layer that would diffuse into the monocrystalline layer 40 and upset the stability of the semiconductor devices formed therein.

In step 3, a base or substrate polycrystalline silicon layer 44 is formed by standard deposition. The polycrystalline layer 44 functions as the primary support layer for the resulting integrated device arrangement.

Steps 2A and 3A are alternate steps in the fabrication process that can be followed in lieu of steps 2 and 3. In step 2A, a glass coating 42A is formed on a polycrystalline substrate 44A by centrifuging or sputtering techniques. Hence, with the structure of step 1 which is shown in step 2A as monocrystalline substrate 40A and $SiO_2$ layer 41A, the composite structure of step 3A is fabricated by bonding together the two separate structures of step 2A. Therefore, step 3A shows the composite structure of a $SiO_2$ coated monocrystalline silicon layer 40A having a glass layer 42A bonded thereto which is in turn bonded to a polycrystalline support or base layer 44A.

Referring to step 4, which is the next step in the fabrication process after either step 3 or step 3A, the composite structure is inverted and regions of P-and N-type conductivity are formed in the monocrystalline layer 40B as described above with respect to step 2 of FIG. 2. The reference numerals employed in this FIG. are similar to the reference numerals used in FIG. 2 with the change being that the number 3 is added to the first digit of each two digit reference numeral.

Similarly, step 5 is carried out in the same manner as step 3 of FIG. 2 so as to provide a plurality of isolated semiconductor devices on a $SiO_2$-glass-polycrystalline composite substrate.

In step 6, a $SiO_2$ layer 49B is thermally grown or deposited on the surface of the isolated semiconductor devices which includes the semiconductor surface defining the moat regions. Hence, the $SiO_2$ layer 49B merges with the $SiO_2$ layer 41B at the bottom of each moat thereby completely encapsulating each semiconductor device with a protective coating. Subsequently, a glass layer 51B is deposited on the $SiO_2$ layer 29B. Preferably, the glass layer is approximately twice the thickness of the $SiO_2$ layer 49B.

In step 7, leads 52B are formed by metal evaporation or sputtering techniques after suitable holes have been formed in the glass and oxide layers. The resulting structure shown in step 7 depicts an $SiO_2$-glass encapsulated integrated device structure with the $SiO_2$ encapsulation 49B and 41B serving to protect each isolated semiconductor device from contamination from the impurities in the glass layers 42B and 51B. A mixture of $P_2O_5 \cdot SiO_2$ glass has been found to be particularly useful for the glass layer 51B in enhancing the stability characteristics for each isolated device.

It should be apparent to those skilled in the art that interconnecting can be made between desired semiconductor devices of the ultimate integrated structure shown in FIGS. 2 and 4 by using suitable interconnection techniques for bridging the moats between devices as illustrated by a patent application identified as 466,182, filed June 23, 1965, in the names of Chiou and Garcia and assigned to the same assignee as this invention: In the final step of FIG. 4, the encapsulating oxide layer 41B, 49B preferably has a thickness of approximately 0.5 microns; the glass regions 42B, 51B have a thickness of about 1 or 2 microns; the polycrystalline substrate 44B has a thickness of about 8 mils, and the semiconductor devices have a thickness of less than 10 microns.

While the invention has been particularly shown and described with reference to preferred embodiments thereof, it will understood by those skilled in the art that the foregoing and other changes in form and details may be made therein without departing from the spirit and scope of the invention.

We claim:

1. An integrated semiconductor structure comprising, in combination:

a polycrystalline semiconductor support member;

a glass insulating layer bonded to said polycrystalline support member;

an oxide layer bonded to said glass layer; and a plurality of encapsulated, dielectrically isolated, semiconductor devices located on said oxide layer.

2. An integrated semiconductor structure in accordance with claim 1, in which said polycrystalline semiconductor support member being silicon, said oxide layer being silicon dioxide, and said semiconductor devices being of silicon semiconductor material, the thermal coefficients of expansion of said polycrystalline silicon support member, said glass layer, and said silicon semiconductor material of said devices being substantially the same.

3. An integrated semiconductor structure in accordance with claim 2, in which a layer of silicon dioxide completely encapsulates each of said plurality of semiconductor devices.

4. An integrated semiconductor structure in accordance with claim 3, in which a glass layer overcoats the portion of said oxide layer located on the surface of the monocrystalline semiconductor devices.

5. An integrated semiconductor structure in accordance with claim 4, in which said overcoat glass layer consists of a $P_2O_5 \cdot SiO_2$ glass composition.

6. An integrated semiconductor device structure in accordance with claim 4, in which each of said plurality of semiconductor devices being separated from the others by isolation moats, said glass layer bonded to said polycrystalline member consisting of by weight percent 82.8 percent of $SiO_2$, 11.4 percent of $B_2O_3$, 5.3 percent of $Al_2O_3$ and trace amounts of both $Na_2O$ and $ZrO_2$.